(12) United States Patent
Shang et al.

(10) Patent No.: US 12,313,929 B2
(45) Date of Patent: May 27, 2025

(54) DISPLAY PANEL AND DISPLAY APPARATUS

(71) Applicants: Beijing BOE Display Technology Co., Ltd., Beijing (CN); BOE Technology Group Co., Ltd., Beijing (CN)

(72) Inventors: Shiming Shang, Beijing (CN); Xiaoqing Peng, Beijing (CN); Hailin Xue, Beijing (CN); Weida Qin, Beijing (CN); Yanyun Li, Beijing (CN); Shaokai Su, Beijing (CN); Shaoming Yan, Beijing (CN); Wei Min, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/274,687

(22) PCT Filed: Aug. 19, 2022

(86) PCT No.: PCT/CN2022/113762
§ 371 (c)(1),
(2) Date: Jul. 27, 2023

(87) PCT Pub. No.: WO2024/036638
PCT Pub. Date: Feb. 22, 2024

(65) Prior Publication Data
US 2025/0085583 A1    Mar. 13, 2025

(51) Int. Cl.
*G02F 1/1335* (2006.01)
*H10K 59/80* (2023.01)

(52) U.S. Cl.
CPC .. *G02F 1/133512* (2013.01); *G02F 1/133526* (2013.01); *H10K 59/879* (2023.02); *H10K 59/8792* (2023.02)

(58) Field of Classification Search
CPC ......... G02F 1/133526; G02F 1/133512; H01L 25/167; H01L 25/0753; H10H 29/855; H10H 29/8552
See application file for complete search history.

(56) References Cited

U.S. PATENT DOCUMENTS

2012/0162763 A1   6/2012  Son et al.
2014/0111719 A1*  4/2014  Sekine ............. G02F 1/136286
                                                349/41
(Continued)

FOREIGN PATENT DOCUMENTS

CN    101951528 A  *  1/2011
CN    102572473 A     7/2012
(Continued)

*Primary Examiner* — Mariceli Santiago
(74) *Attorney, Agent, or Firm* — IPro, PLLC (57) ABSTRACT

Provided is a display panel, including: a base substrate, a display structure, a black matrix pattern, and a cylindrical lens structure layer. The black matrix pattern includes a plurality of first openings. The display panel is provided with a plurality of sub-pixel regions arranged in rows and columns. The first openings are disposed in the sub-pixel regions. The cylindrical lens structure layer includes a plurality of strip-shaped cylindrical lens structure and has a plurality of focal lines in an orthographic projection on the black matrix pattern. The focal lines are parallel to the length direction of the cylindrical lens structures. The focal lines partition each sub-pixel region into a plurality of regions. One of the plurality of regions is a non-crosstalk region. The black matrix pattern further includes second openings in the non-crosstalk regions. The second openings are disposed outside regions where the first openings are disposed.

20 Claims, 10 Drawing Sheets

(56) References Cited

U.S. PATENT DOCUMENTS

| | | |
|---|---|---|
| 2016/0139420 A1 | 5/2016 | Wei et al. |
| 2022/0206313 A1* | 6/2022 | Park .................. G02F 1/133512 |
| 2023/0125908 A1 | 4/2023 | Diao et al. |

FOREIGN PATENT DOCUMENTS

| | | | |
|---|---|---|---|
| CN | 103838014 A | | 6/2014 |
| CN | 109445196 A | | 3/2019 |
| CN | 110351544 A | | 10/2019 |
| JP | 2014235896 A | | 12/2014 |
| KR | 101925459 B1 | * | 12/2018 |
| WO | 2021110041 A1 | | 6/2021 |

* cited by examiner

DISPLAY PANEL AND DISPLAY APPARATUS

CROSS-REFERENCE TO RELATED APPLICATION

The present disclosure is a U.S. national stage of international application No. PCT/CN2022/113762, filed on Aug. 19, 2022, the content of which is herein incorporated by reference in its entirety.

TECHNICAL FIELD

The present disclosure relates to the field of display technologies, and in particular, relates to a display panel and a display apparatus.

BACKGROUND OF THE INVENTION

Display panels are devices capable of displaying images.

SUMMARY OF THE INVENTION

Embodiments of the present disclosure provide a display panel and a display apparatus. The technical solutions are as follows.

According to some embodiments of the present disclosure, a display panel is provided. The display panel includes:
- a base substrate;
- a display structure disposed on the base substrate;
- a black matrix pattern disposed on the base substrate provided with the display structure, wherein the black matrix pattern includes a plurality of first openings; wherein the display panel is provided with a plurality of sub-pixel regions arranged in rows and columns, and the first openings are disposed in the sub-pixel regions; and
- a cylindrical lens structure layer disposed on the base substrate provided with the black matrix pattern, wherein the cylindrical lens structure layer includes a plurality of strip-shaped cylindrical lens structures;
- wherein a specified included angle is defined between the length direction of the cylindrical lens structures and a column direction of the plurality of sub-pixel regions, the specified included angle is greater than 0 degrees and less than 90 degrees, the cylindrical lens structure layer has a plurality of focal lines in an orthographic projection on the black matrix pattern, the focal lines are parallel to the length direction of the cylindrical lens structures, the focal lines partition each sub-pixel region into a plurality of regions, and one of the plurality of regions is a non-crosstalk region;
- wherein the black matrix pattern further includes second openings in the non-crosstalk regions, and the second openings are disposed outside regions where the first openings are disposed.

In some embodiments, the non-crosstalk region is a region having a largest area among the plurality of regions; or in the case that two regions among the plurality of regions have a largest area, one of the two regions having the largest area is the non-crosstalk region.

In some embodiments, the second openings are connected to the first openings in a direction parallel to the base substrate.

In some embodiments, the plurality of sub-pixel regions are arranged in the display panel in rows and columns; and the black matrix pattern includes a plurality of first black matrices parallel to a row direction of the plurality of sub-pixel regions, and a plurality of second black matrices parallel to a column direction of the plurality of sub-pixel regions, wherein the plurality of first black matrices and the plurality of second black matrices are interlaced to form the plurality of first openings; and the second openings are disposed in the first black matrices.

In some embodiments, a distance between every two adjacent focal lines in the plurality of focal lines in the row direction is the same as a dimension of the sub-pixel region in the row direction; and the second opening is provided with two edges arranged in the row direction one edge of the second opening in the row direction is coincident with a focal line on an edge of the non-crosstalk region; and the other edge of the second opening in the row direction is coincident with an edge of the sub-pixel region.

In some embodiments, a dimension of the second opening in the column direction is less than or equal to 9% of a length of the sub-pixel region in the column direction.

In some embodiments, the second opening is quadrilateral; and an edge of the second opening in the row direction is coincident with an edge of the first opening.

In some embodiments, the second opening is disposed in at least one of every two adjacent first black matrices in the column direction.

In some embodiments, a width of the first black matrix is greater than a width of the second black matrix.

In some embodiments, the second black matrix includes an extending portion, wherein the extending portion is in a crosstalk region in the sub-pixel region, and the crosstalk region is a region outside the non-crosstalk region in the sub-pixel region and.

In some embodiments, the sub-pixel region is rectangular; the sub-pixel region includes crosstalk regions at two diagonal corners of the sub-pixel region; and at least one of every two adjacent second black matrices in the row direction includes the extending portion.

In some embodiments, the display structure includes a plurality of light-emitting units arranged in an array; or the display structure includes a liquid crystal layer.

According to some embodiments of the present disclosure, a display apparatus is provided. The display apparatus includes the display panel as described above.

BRIEF DESCRIPTION OF DRAWINGS

For clearer descriptions of the technical solutions in the embodiments of the present disclosure, the following briefly describes the accompanying drawings required for describing the embodiments. Apparently, the accompanying drawings in the following description illustrate merely some embodiments of the present disclosure, and a person of ordinary skill in the art may still derive other drawings from these accompanying drawings without creative efforts.

The accompanying drawings have illustrated specific embodiments of the present disclosure, and are to be described in detail as follows. These accompanying drawings and text descriptions are not intended in any way to limit the scope of the concept of the present disclosure, but to illustrate the conception of the present disclosure for those skilled in the art with reference to specific embodiments.

DETAILED DESCRIPTION

For clearer descriptions of the objectives, technical solutions, and advantages of the present disclosure, embodiments of the present disclosure are described in detail below with reference to the accompanying drawings.

Currently, stereoscopic display technologies have been widely applied in the field of display technologies. The stereoscopic display technologies use parallax between the left eye and the right eye of a viewer to make the viewer obtain a stereoscopic sense. The stereoscopic display technologies that are popular currently are categorized into stereoscopic display technologies that require a viewer to wear beam-splitting glasses and autostereoscopic display technologies that allow a viewer to watch directly. The autostereoscopic display technologies are widely applied in many fields, such as military affairs, medical treatment, entertainment, education, advertisement, and data visualization. Autostereoscopic display is an important topic in the field of display technologies.

Cylindrical lens (lenticular sheets)-based stereoscopic display is autostereoscopic display technology that is commonly used currently. According to the technology, cylindrical lens structures are disposed in a display panel to enable images in different regions of the display panel to reach different fields of view, such that the left and right eyes of a user watching a screen of the display panel are in different fields of view, and thus receive different images. Therefore, parallax is generated, and the user acquires a stereoscopic display sense.

A display panel, which has a stereoscopic display function, includes a base substrate, a plurality of light-emitting units disposed on the base substrate, and black matrices and cylindrical lens structures that are disposed above the light-emitting units. A specific included angle is present between a length direction of the cylindrical lens structures and an arrangement direction of the light-emitting units (the cylindrical lens structures are slant relative to the light-emitting units), such that upon passing through the cylindrical lenses, light emitted by light-emitting units in different regions is projected to different fields of view, such that the stereoscopic display function is implemented.

However, because the cylindrical lenses are slant relative to the light-emitting units, it is difficult to make the cylindrical lenses completely align with the light-emitting units. As a result, crosstalk of the display panel is severe, causing a relatively poor display effect of the display panel.

Figure 1:
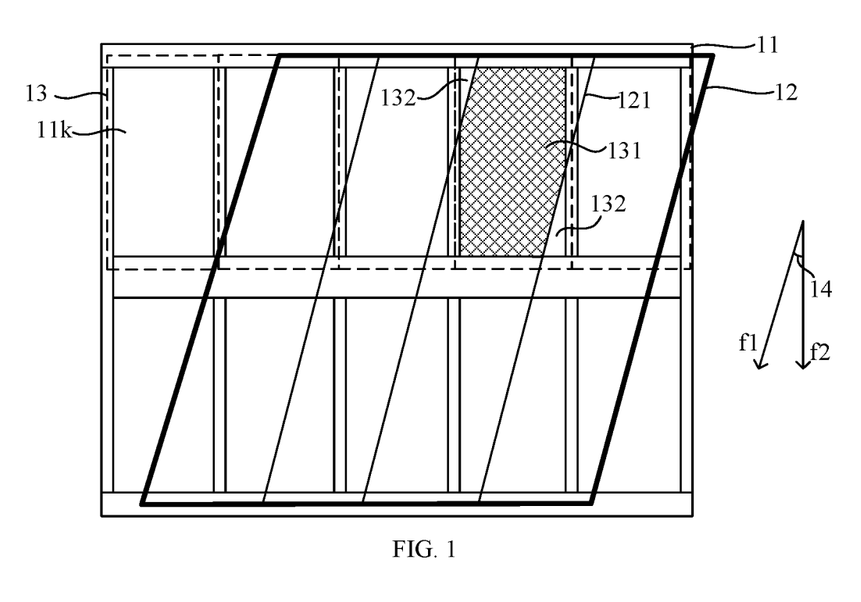
FIG. 1 is a schematic structural diagram of a display panel.

FIG. 1 is a schematic structural diagram of a display panel. The display panel includes a display structure (not illustrated in FIG. 1), a black matrix pattern 11 on the display structure, and a cylindrical lens structure 12 on the black matrix pattern 11. The display panel is provided with a plurality of sub-pixel regions 13 (each sub-pixel region 13 has one display structure). The black matrix pattern 11 is provided with one opening 11k in each sub-pixel region 13. The plurality of sub-pixel regions 13 are arranged in the display panel in rows and columns. An included angle 14 is defined between a length direction f1 of the cylindrical lens structures 12 and a column direction f2 of the sub-pixel regions 13 (inclination alleviates moire patterns and reduces loss of resolution in the column direction). The cylindrical lens structure is a structure having a cylindrical lens or a cylindrical prism. The cylindrical lens or cylindrical prism has a length direction. The length direction is parallel to a surface of the cylindrical lens structure.

Since the cylindrical lens structures are inclined relative to the sub-pixels, the cylindrical lens structures above different regions in a same sub-pixel region have different shapes. As a result, beams emitted from different regions of the same sub-pixel have different fields of view, causing crosstalk.

Specifically, the cylindrical lens structure 12 in an orthographic projection on the black matrix pattern 11 has a plurality of focal lines 121 (the focal lines are not real lines, but are virtual lines defined for determining crosstalk regions and a non-crosstalk region). The focal lines 121 are parallel to each other. The focal lines 121 are parallel to the length direction f1 of the cylindrical lens structure 12. The focal lines 121 partition each of the sub-pixel region 13 into a plurality of regions. One of the plurality of regions is a non-crosstalk region, and the other regions are crosstalk regions. For example, a largest region 132 is determined as the non-crosstalk region, and the other smaller regions are determined as the crosstalk regions. For this sub-pixel region, a crosstalk value is a proportion of light output of the crosstalk region based on a total light output of the sub-pixel region.

It should be noted that the non-crosstalk region is one of the plurality of regions partitioned by the focal lines 121. For example, one of the regions is pre-assigned as the non-crosstalk region based on viewpoint layout design. Subsequently, calculation and control of the display panel are performed based on the non-crosstalk region.

Figure 2:
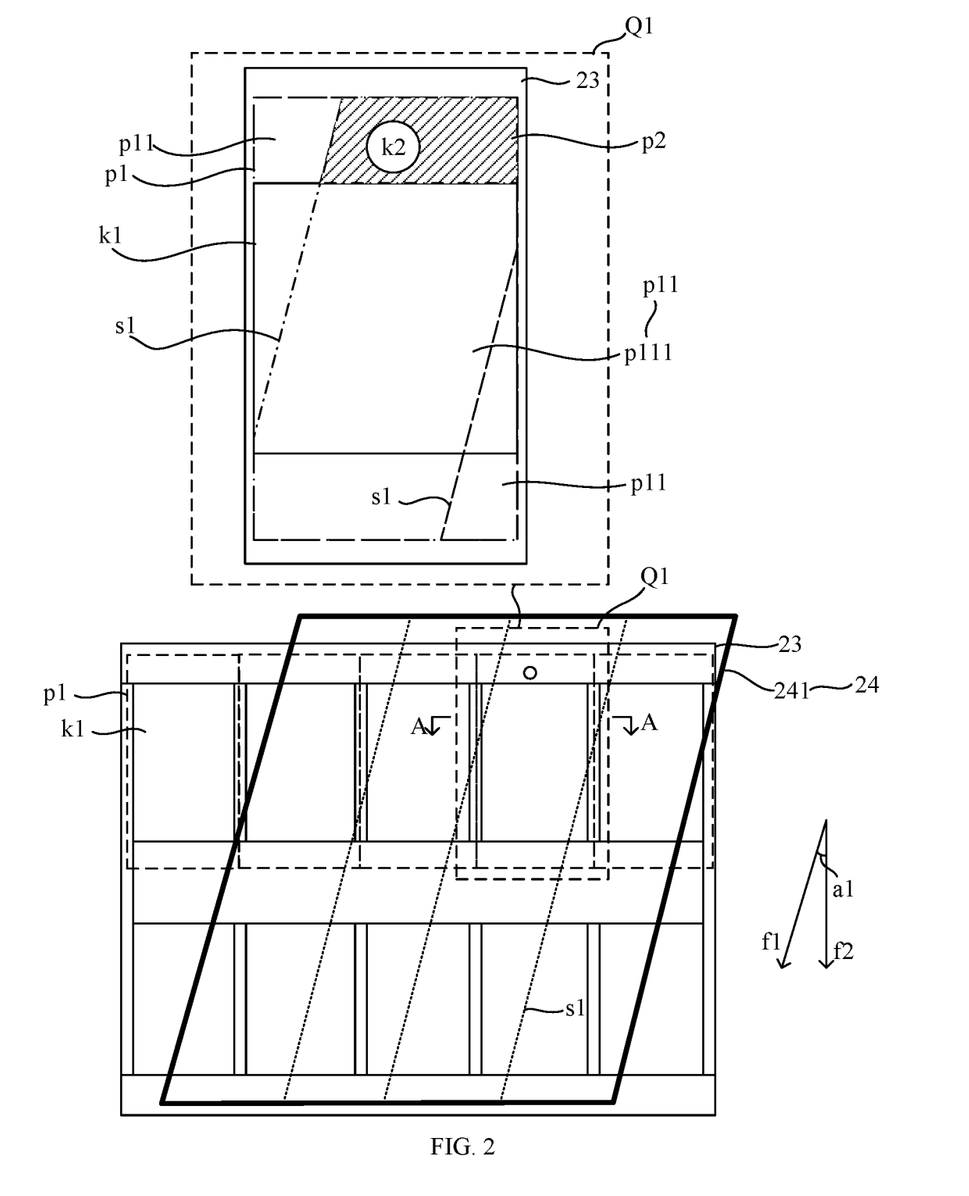
FIG. 2 is a schematic structural diagram of a display panel according to some embodiments of the present disclosure.
Figure 3:
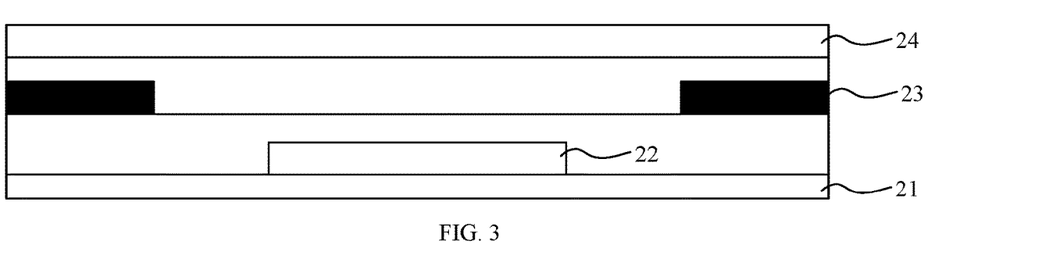
FIG. 3 is a schematic diagram of a cross-section structure of the display panel in FIG. 2.

FIG. 2 is a schematic structural diagram of a display panel according to some embodiments of the present disclosure (the dashed box Q1 in FIG. 2 illustrates a schematic structural diagram of a sub-pixel region). FIG. 3 is a schematic diagram of a cross-section structure of the display panel in FIG. 2 (a position of the section is A-A). Referring to FIG. 2 and FIG. 3, the display panel includes:

a base substrate 21, a display structure 22 disposed on the base substrate 21, a black matrix pattern 23 disposed on the base substrate 21 provided with the display structure 22, wherein the black matrix pattern 23 includes a plurality of first openings k1; wherein the display panel is provided with a plurality of sub-pixel regions p1 arranged in rows and columns, and the first openings k1 are disposed in the sub-pixel regions p1; and a cylindrical lens structure layer 24 disposed on the base substrate 21 provided with the black matrix pattern 23, wherein the cylindrical lens structure layer 24 includes a plurality of strip-shaped cylindrical lens structures 241; wherein a specified included angle a1 is defined between a length direction f1 of the cylindrical lens structures 241 and a column direction f2 of the plurality of sub-pixel regions p1, the specified included angle a1 is greater than 0 degrees and less than 90 degrees, the cylindrical lens structure layer 24 in the orthographic projection on the black matrix pattern 23 has a plurality of focal lines s1, the focal lines s1 are parallel to the length direction f1 of the cylindrical lens structures 241, the focal lines s1 partition each of the sub-pixel regions p1 into a plurality of regions p11, and one of the plurality of regions p11 is a non-crosstalk region p111.

Referring to FIG. 2, the black matrix pattern 23 further includes second openings k2 in the non-crosstalk regions p111, and the second openings k2 are outside regions where the first openings k1 are disposed, that is, the second openings are in the shadow region p2 in FIG. 2.

Figure 4:
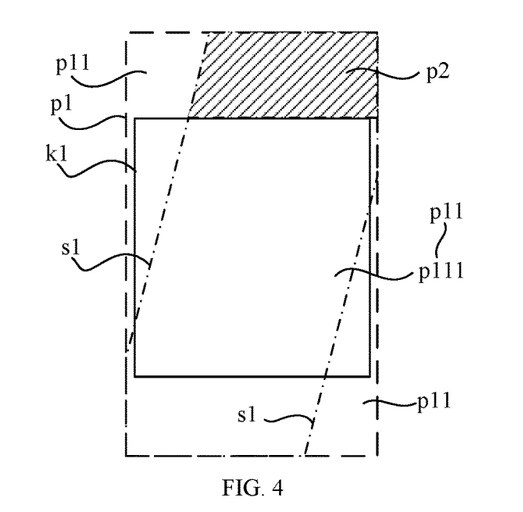
FIG. 4 is a schematic diagram of a sub-pixel region according to some embodiments of the present disclosure.

In addition, FIG. 4 is a schematic diagram of a sub-pixel region according to some embodiments of the present disclosure. For clear illustration of each region, a black matrix pattern is not illustrated in FIG. 4. Focal lines s1 partition the sub-pixel region p1 into three regions p11. One of the regions is a non-crosstalk region p111, and the other regions are crosstalk regions. A second opening is in a shadow region p2 (the shadow region p2 is a region in the first opening in the middle of the non-crosstalk region).

Figure 5:
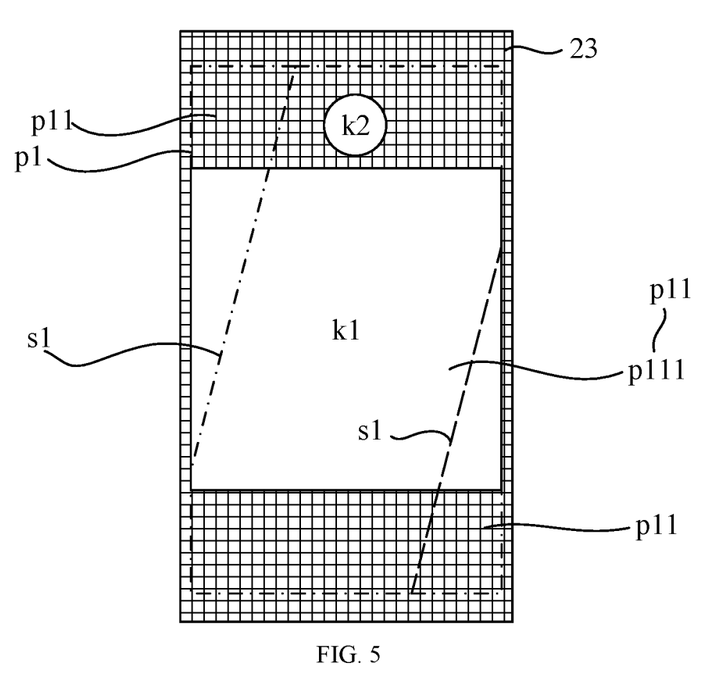
FIG. 5 is a schematic structural diagram of a sub-pixel region in the display panel in FIG. 2.

It should be noted that for clear illustration of each structure, the black matrix pattern is not filled in FIG. 2, which is not limited in the embodiments of the present disclosure. For example, the black matrix pattern is black. For convenient illustration of the black matrix pattern, FIG. 5 is a schematic structural diagram of a sub-pixel region in the display panel in FIG. 2. In FIG. 5, a portion in the black matrix pattern 23 with black matrices is filled. It is learned from FIG. 5 that a circular second opening k2 is disposed above a rectangular first opening k1. The Shapes of the first opening k1 and the second opening k2 are not limited in the embodiments of the present disclosure.

It should be noted that the orthographic projection on the black matrix pattern in the embodiments of the present disclosure refers to an orthographic projection on a plane where the black matrix pattern is within.

In summary, the embodiments of the present disclosure provide a display panel. In the display panel, the second openings are formed in the portion of the black matrix pattern in the non-crosstalk regions to increase beams emitted from the non-crosstalk regions. Therefore, a proportion of beams emitted from the crosstalk regions outside the non-crosstalk regions to all beams emitted from the display panel decreases correspondingly. In this way, the crosstalk of the display panel is reduced, such that the problem that the display effect of a display panel is relatively poor due to severe crosstalk in some practices is solved, and the display effect of the display panel is improved.

In addition, since an area of a light-outputting region is increased, the transmittance of the display panel in the embodiments of the present disclosure is also increased, such that the luminance of the display panel is improved.

In the display panel according to the embodiments of the present disclosure, the cylindrical lens structure is a lens-type cylindrical lens structure, or the cylindrical lens structure is a prism-type cylindrical lens structure.

In some exemplary embodiments, the cylindrical lens structure layer includes a plurality of cylindrical lens structures. At least one sub-pixel region is disposed in a region which an orthographic projection of one cylindrical lens structure on the base substrate is within. For example, to simplify a structure of the cylindrical lens structure layer, a plurality of sub-pixel regions are disposed in the region which the orthographic projection of one cylindrical lens structure on the base substrate is within.

It should be noted that, in the embodiments of the present disclosure, the non-crosstalk region is one of a plurality of regions of a sub-pixel region partitioned by at least one focal line, for example, is any region or a pre-assigned region, which is not limited in the embodiments of the present disclosure.

In some exemplary embodiments, the non-crosstalk region is a largest region of a plurality of regions of a sub-pixel region partitioned by at least one focal line. In this structure, light emitted from the non-crosstalk region is increased to reduce the crosstalk of the display panel. In the case that there are two largest regions in the plurality of regions partitioned by the focal line (that is, areas of two regions are the largest), one of the two regions is the non-crosstalk region.

However, since a portion of the non-crosstalk region is occupied by the black matrix, a region that is in the non-crosstalk region and that is not covered by the black matrix is a region from which light is actually emitted. Based on this, a portion of the black matrix pattern is in the non-crosstalk region, that is, the black matrix pattern shields a portion of the non-crosstalk region. According to the embodiments of the present disclosure, the second opening is formed in the black matrix pattern in the non-crosstalk region to increase light output of the non-crosstalk region. Therefore, the total light output of the sub-pixel region is increased. Correspondingly, a proportion of light output of the crosstalk region (a region in the sub-pixel region other than the non-crosstalk region is a crosstalk region) based on the total light output of the sub-pixel region is decreased, such that the crosstalk of the display panel is reduced.

Figure 6:
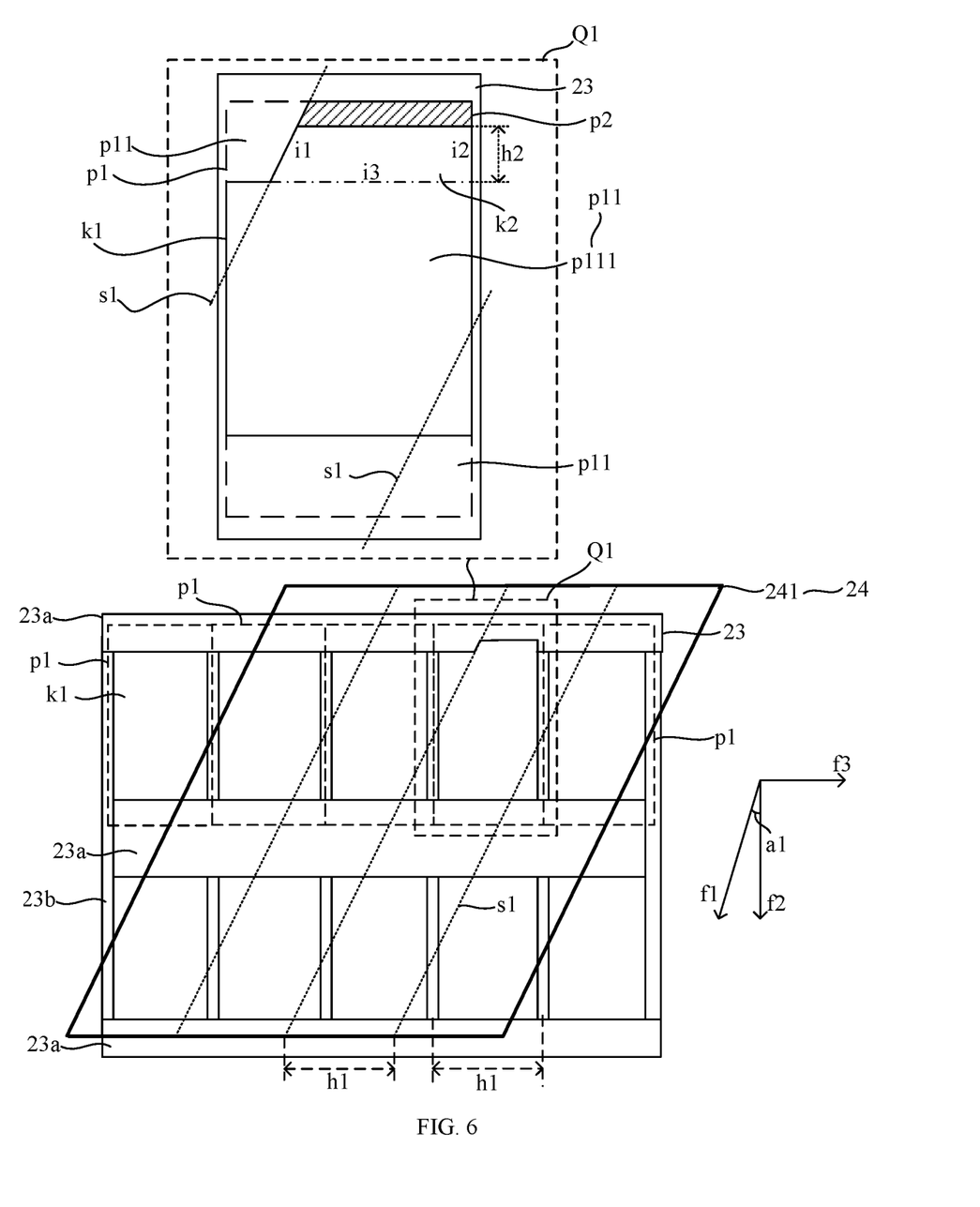
FIG. 6 is a schematic structural diagram of another display panel according to some embodiments of the present disclosure.
Figure 7:
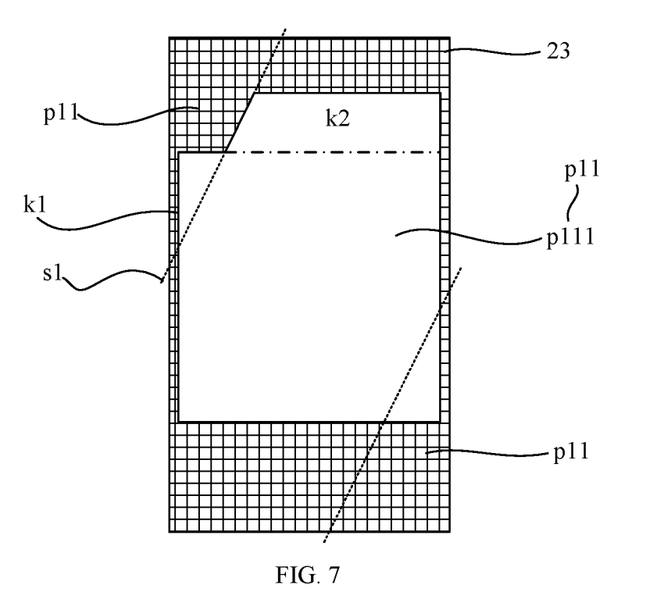
FIG. 7 is a schematic structural diagram of a sub-pixel region in the display panel in FIG. 6.

FIG. 6 is a schematic structural diagram of another display panel according to some embodiments of the present disclosure. FIG. 7 is a schematic structural diagram of a sub-pixel region in the display panel in FIG. 6 (in FIG. 7, for clear illustration of the first opening and the second opening, the black matrix pattern is filled). Referring to FIG. 6 and FIG. 7, the display panel is obtained by performing some adjustment on the display panel in FIG. 2. The second opening k2 is connected to the first opening k1 in a direction (namely, a direction in FIG. 7 and parallel to a surface of paper) parallel to the base substrate. In this structure, the second opening k2 and the first opening k1 are connected to form a larger opening. Due to the larger opening, more light that does not generate crosstalk is emitted out to reduce integral crosstalk of the display panel. In the embodiments of the present disclosure, the plurality of sub-pixel regions p1 are disposed on the orthographic projections of the cylindrical lens structures 241 on the black matrix pattern 23.

As illustrated in FIG. 6, the plurality of sub-pixel regions p1 are arranged in the display panel in rows and columns, that is, the plurality of sub-pixel regions p1 are arranged in a plurality of rows and a plurality of columns. FIG. 6 illustrates two of the rows and five of the columns.

The black matrix pattern 23 includes a plurality of first black matrices 23a parallel to the row direction f3 of the plurality of sub-pixel regions p1, and a plurality of second black matrices 23b parallel to the column direction f2 of the plurality of sub-pixel regions p1. The plurality of first black matrices 23a and the plurality of second black matrices 23b are interlaced to form the plurality of first openings k1. The second openings k2 are in the first black matrices 23a. In other words, the second openings k2 are in the first black matrices 23a extending in the row direction f3, but not in the second black matrices 23b extending in the column direction f2. In this way, positions where the second openings k2 are formed are simplified. In some exemplary embodiments, each sub-pixel region p1 is rectangular; and a long edge of the sub-pixel region p1 is parallel to the column direction f2 of the plurality of sub-pixel regions p1.

In some exemplary embodiments, a width of the first black matrix 23a is greater than a width of the second black matrix 23b. In this structure, an area of the first black matrix 23a whose width is larger is correspondingly larger than that of the second black matrix 23b. Therefore, formation of the second opening k2 is facilitated; and a dimension of the second opening k2 is increased; and crosstalk is further reduced. In addition, it is learned from FIG. 6 that the crosstalk region p11 is triangular. In the column direction f2, the dimension of the triangular region is positively correlated with a distance from the triangular region to an edge of the sub-pixel region p1. That is, in the case that the triangular region is closer to an upper edge or a lower edge of the sub-pixel region p1, the dimension of the crosstalk region is larger. In the case that the width of the first black matrix 23a in the row direction f3 is increased, most of the crosstalk region is shielded to reduce the crosstalk of the display panel. In other words, the width of the first black matrix 23a in the row direction f3 is increased to ensure that the width of the first black matrix 23a is greater than the width of the second black matrix 23b. This achieves an effect of reducing crosstalk of the display panel.

The following description uses a B8 55UHD (a specification of a display panel) display panel as an example. The width of the black matrix in the row direction is 60 μm (micrometers); the crosstalk is 14.3%; and the transmittance is 66.5% of 2D (2D is a display panel without a prism structure).

Further, referring to FIG. 8 which is a schematic structural diagram of a display panel, in the case that the width of the black matrix in the row direction is increased, calculation formulas are as follows:

Area of crosstalk =
$$0.5 \times \frac{(x - \text{atan}\theta - 0.5\text{Atan}\theta - 0.5B)^2}{\tan\theta} + 0.5 \times \frac{(c\tan\theta - 0.5B)^2}{\tan\theta}$$

Total area of light-outputting regions=$(L-A) \times (x-B)$.

Application ranges of parameters in the formulas are as follows: $0 < B < x$, and $\tan^{-1} x/1.5y < \theta < \tan^{-1} x/y$.

A denotes the width of the black matrix in the column direction, B denotes the width of the black matrix in the row direction, x denotes a dimension of the sub-pixel region in the column direction, y denotes a dimension of the sub-pixel region in the row direction, θ denotes the included angle between the length direction of the prism structure and the row direction, L denotes a distance between two adjacent focal lines s1 in the row direction, and a, b, c, and d are four portions of edges of two adjacent sub-pixel regions partitioned by two adjacent focal lines s1.

According to the formulas, in the case that the width of the black matrix in the row direction is increased to 160 μm, the crosstalk is 6.4%, and the transmittance is 40.6% of that before the width of the black matrix is increased. It is learned that the crosstalk of the display panel is reduced obviously by increasing the width of the black matrix in the row direction. It should be noted that for clear illustration of the sub-pixel region, the width of the black matrix is not illustrated in FIG. 8. However, the width is not limited in the present disclosure.

However, in the case that the width of the first black matrix 23a in the row direction f3 is increased, a portion of the non-crosstalk region p111 is also shielded, which decreases the light output of the non-crosstalk region p111. In the display panel according to the embodiments of the present disclosure, impact of a widened first black matrix 23a on the crosstalk is reduced by forming the second opening k2 in a portion of the first black matrix 23a disposed in the non-crosstalk region p111.

Referring to FIG. 6 and FIG. 7, in some exemplary embodiments, dimensions of two adjacent focal lines s1 in the plurality of focal lines s1 in the row direction f3 are the same as a dimension of the sub-pixel region in the row direction, and both are h1.

The second opening k2 is provided with an edge i1 and an edge i2 arranged in the row direction f3. The edge i1 of the second opening k2 in the row direction f3 is coincident with a focal line s1 on an edge of the non-crosstalk region. The other edge i2 of the second opening k2 in the row direction f3 is coincident with an edge of the sub-pixel region p1. In such a structure, in the case that the area of the second opening k2 is increased, the crosstalk is prevented from being increased by the enlarged second opening k2.

In some embodiments, a dimension h2 of the second opening k2 in the column direction f2 is 9% less than or equal to the length of the sub-pixel region p1 in the column direction f2. The second opening k2 of this dimension not only further reduces the crosstalk of the display panel, but also avoids moire patterns caused by an excessively large second opening k2, such that the moire patterns of the display panel are basically invisible to naked eyes during image display.

The second opening k2 is quadrilateral. An edge i3 of the second opening k2 in the column direction is coincident with an edge of the first opening k1. In this structure, the area of the light-outputting region of the non-crosstalk region is further increased to reduce the crosstalk of the display panel.

In some embodiments, at least one of every two adjacent first black matrices in the column direction f2 has the second opening k2. FIG. 6 shows a structure in which one first black matrix has the second opening k2. However, this is not limited in the embodiments of the present disclosure. For example, referring to FIG. 9 which is a schematic structural diagram of another sub-pixel region in the display panel in FIG. 6, each of every two adjacent first black matrices 23a forming the first opening k1 in the column direction f2 has the second opening k2. Compared with the structure of the sub-pixel region in FIG. 7, the structure of the sub-pixel region in FIG. 9 further increases the light-outputting area of the non-crosstalk region of the sub-pixel region to reduce the crosstalk of the display panel. The crosstalk region in the structure in FIG. 9 is the same as or similar to that in the structure in FIG. 8.

Total area of light-outputting regions =
$$(L-A) \times (x-B) + \left(1.5b + \frac{B-h2}{\tan\theta} - A\right) \times h2,$$

wherein h2 denotes a dimension of the second opening in the column direction. For other parameters, reference is made to the embodiments illustrated in FIG. 8, which are not described herein any further. In the embodiments of the present disclosure, the included angle θ between the length direction of the prism structure and the row direction ranges from 60 degrees to 90 degrees. In some exemplary embodiments, θ ranges from 70 degrees to 85 degrees.

Figure 8:
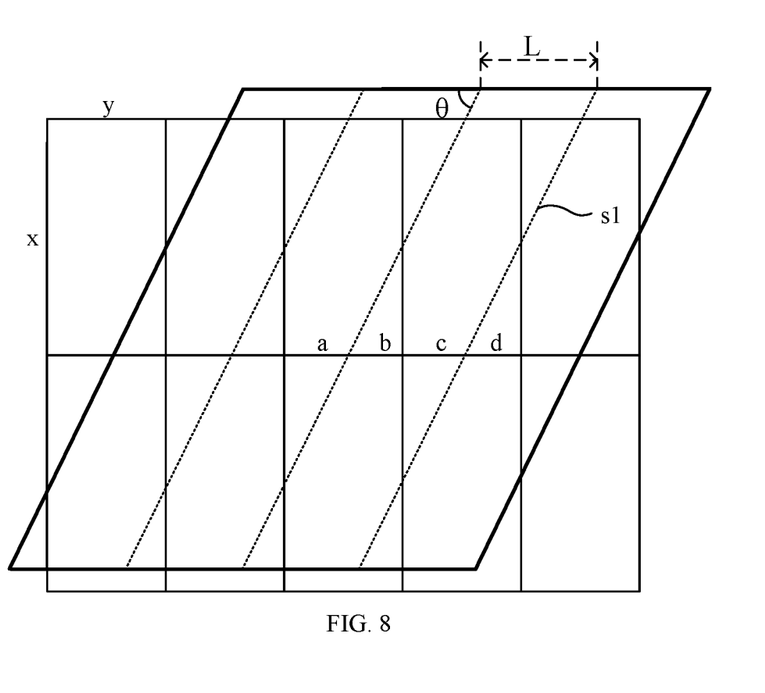
FIG. 8 is a schematic structural diagram of a display panel.
Figure 9:
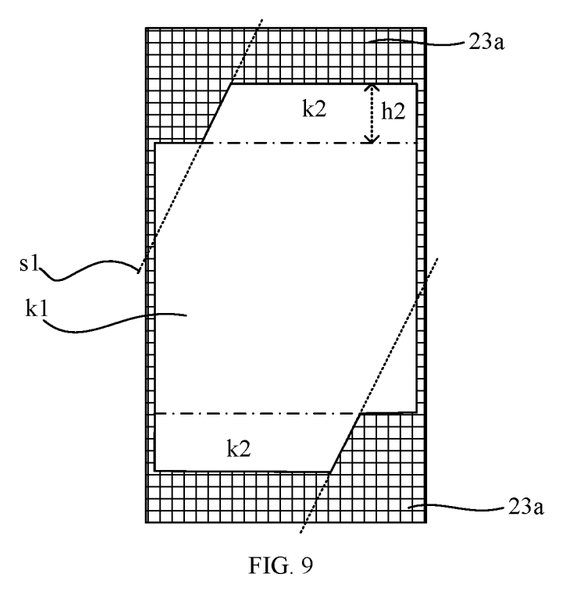
FIG. 9 is a schematic structural diagram of another sub-pixel region in the display panel in FIG. 6.

Compared with the structure in FIG. 8, it is learned that the total area of light-outputting regions in the sub-pixel region in FIG. 9 is increased, such that the crosstalk of the display panel is reduced and the transmittance of the black matrix pattern is increased. In the case that the width of the black matrix in the row direction is 160 μm, and h2 is 21.5 μm, the crosstalk is 5.4%, and the transmittance is 49.7%.

The following description provides some specific measurement parameters for the structures, and uses B10 27UHD (a specification of a display panel) as an example. For values of the crosstalk and the transmittance, reference is made to Table 1:

TABLE 1

Figure 10:
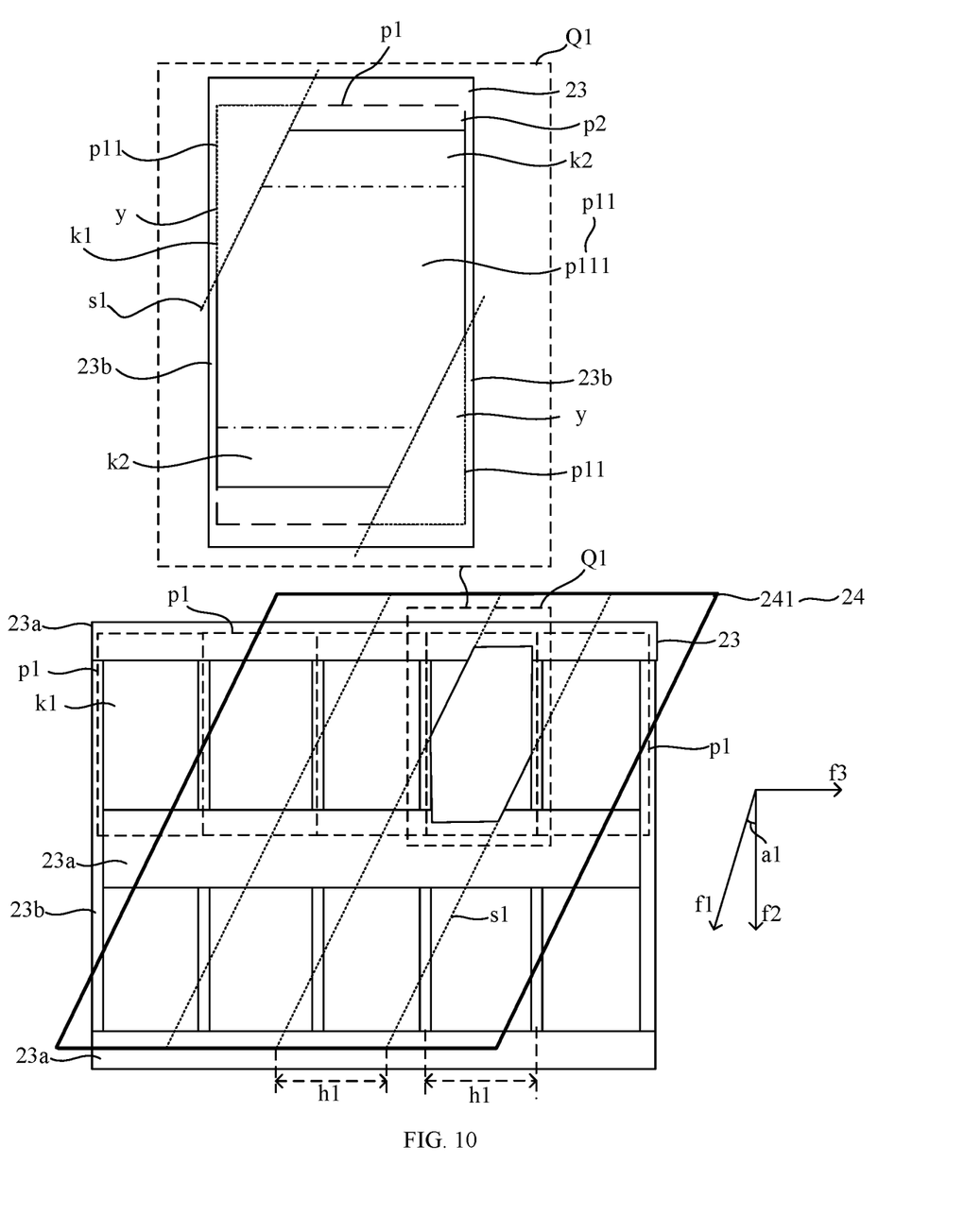
FIG. 10 is a schematic structural diagram of another display panel according to some embodiments of the present disclosure.

| Parameter type | | Width of a black matrix in a row direction being 56 μm | Width of the black matrix in the row direction being 80 μm | Width of the black matrix in the row direction being 105 μm |
|---|---|---|---|---|
| Structure in FIG. 8 | Crosstalk | 10.5% | 6.7% | 3.2% |
| | Transmittance | 53.5% | 40.6% | 27.2% |
| Structure in FIG. 10 | Crosstalk | 0 | 0 | 0 |
| | Transmittance | 53.5% | 40.6% | 27.2% |
| Structure in FIG. 9 | Crosstalk | 10.5% | 5.7% | 2.6% |
| | Transmittance | 53.5% | 45.8% | 39.1% |

The structure in FIG. 8 is one in which only the width of the black matrix in the row direction is increased. The structure in FIG. 9 is one in which the second opening is formed in the black matrix in the non-crosstalk region in the case that the width of the black matrix in the row direction is increased. The structure in FIG. 10 is one in which the crosstalk region is shielded by an extending portion based on the structure in FIG. 9. The values of the crosstalk and the transmittance of various structures are learned from Table 1. For example, in the case that the width of the black matrix in the row direction is 80 μm, in the structure in FIG. 9, the crosstalk of the display panel is 5.7%, and the transmittance is 45.8%. In the case that the width of the black matrix in the row direction is 105 μm, in the structure in FIG. 8, the crosstalk of the display panel is 3.2%, and the transmittance is 27.2%.

It is learned from Table 1 that a larger width of the black matrix in the row direction corresponds to lower crosstalk of the display panel and lower transmittance. In addition, compared with the display panel in the structure in FIG. 10, the display panel in the structure in FIG. 9 has larger crosstalk, but the transmittance of the display panel in the structure in FIG. 9 is improved. Moreover, since there is no extending portion, process requirements such as precision of attaching between the black matrix and another structure are reduced to lower production costs.

Referring to FIG. 10 which is a schematic structural diagram of another display panel according to some embodiments of the present disclosure, a second black matrix 23b includes an extending portion y. The extending portion y is disposed in a crosstalk region p11 in a sub-pixel region. The extending portion y in the second black matrix 23b further shields the crosstalk region p11 to decrease the light-outputting area of the crosstalk region. Therefore, the light output of the crosstalk region is decreased to reduce the crosstalk of the display panel.

Figure 11:
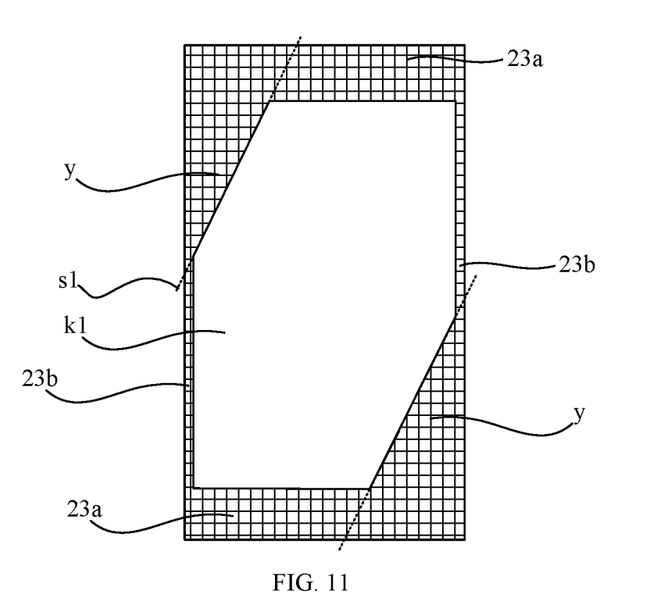
FIG. 11 is a schematic structural diagram of a sub-pixel region in the display panel in FIG. 10.
Figure 12:
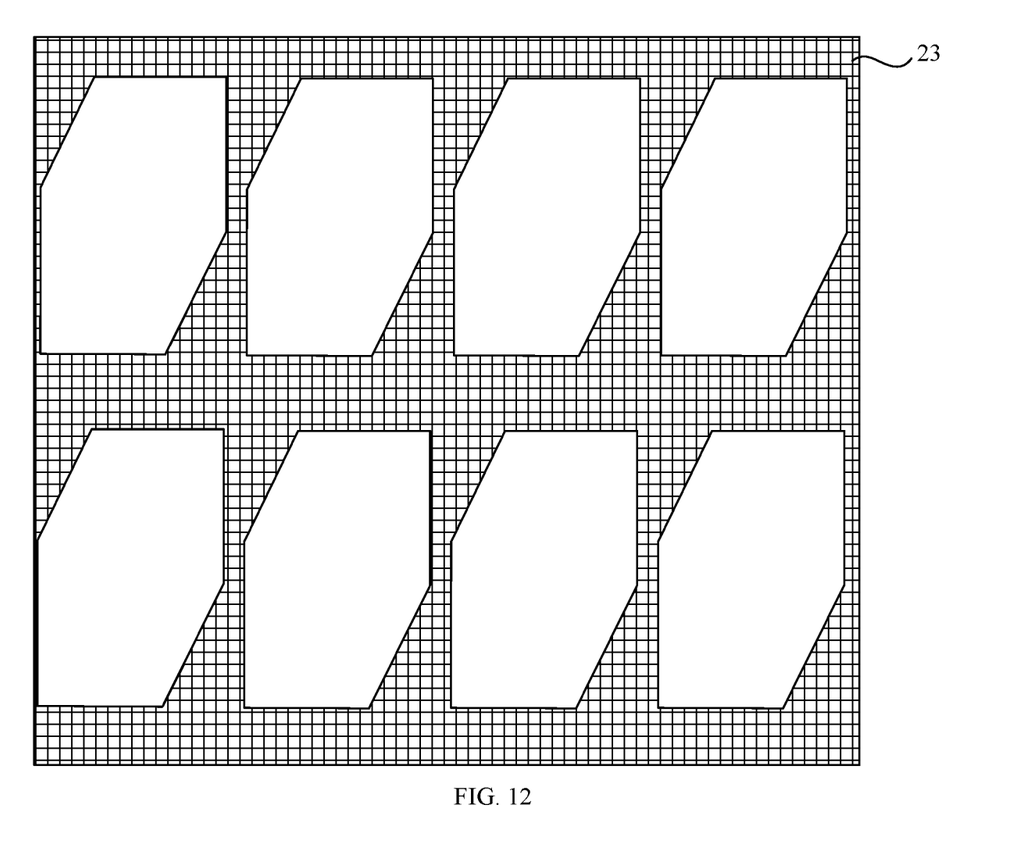
FIG. 12 is a schematic structural diagram of a black matrix pattern in the display panel in FIG. 10.

In some exemplary embodiments, the sub-pixel region p1 is rectangular. The sub-pixel region p1 includes crosstalk regions p11 (namely, two regions p11 at corners of regions partitioned by focal lines) at two diagonal corners of the sub-pixel region p1. At least one of every two adjacent second black matrices 23b in the row direction f3 includes the extending portion y. In the structure in FIG. 10, each of every two adjacent second black matrices 23b includes the extending portion y, which is not limited in the embodiments of the present disclosure. For example, referring to FIG. 11 which is a schematic structural diagram of a sub-pixel region in the display panel in FIG. 10, the first black matrix 23a and the second black matrix 23b are filled in FIG. 11 for clear illustration. The extending portions y are at two diagonal corners. Further, referring to FIG. 12 which is a schematic structural diagram of a black matrix pattern in the display panel in FIG. 10, to illustrate the black matrix pattern 23 clearly, the black matrix pattern 23 is filled in FIG. 12. The black matrix pattern 23 in FIG. 12 shields the crosstalk region, while the non-crosstalk region shielded by the black matrix is exposed, such that the crosstalk of the display panel is reduced and the luminance of the display panel is improved.

The embodiments provide various structures in the sub-pixel region including the sub-pixel structure in FIG. 2, the sub-pixel structure in FIG. 6, the sub-pixel structure in FIG. 9, and the sub-pixel structure in FIG. 10. In the display panel according to the embodiments of the present disclosure, the sub-pixel region has at least one of the structures.

In some exemplary embodiments, in the display panel according to the embodiments of the present disclosure, the display structure includes a plurality of light-emitting units arranged in an array. The light-emitting units includes an organic light-emitting diode (OLED), that is, the display panel is an organic light-emitting diode display panel. For example, the display structure includes a red light-emitting diode configured to emit red light, a green light-emitting diode configured to emit green light, a blue light-emitting diode configured to emit blue light, and the like.

Alternatively, in the display panel according to the embodiments of the present disclosure, the display structure includes a liquid crystal layer, that is, the display panel is a liquid crystal display (LCD) panel.

In the display panel according to the embodiments of the present disclosure, the cylindrical lens structure is a lens-type cylindrical lens structure, or the cylindrical lens structure is a prism-type cylindrical lens structure.

In some exemplary embodiments, the cylindrical lens structure layer includes a plurality of cylindrical lens structures. At least one sub-pixel region is disposed in a region which the orthographic projection of one cylindrical lens structure on the base substrate is within. For example, to simplify a structure of the cylindrical lens structure layer, a plurality of sub-pixel regions are disposed in a region which the orthographic projection of one cylindrical lens structure on the base substrate is within.

In the embodiments of the present disclosure, some of the film structures are prepared according to a composition process. The composition process in the embodiments of the present disclosure includes steps such as photoresist coating, exposing, developing, and photoresist stripping. A film structure is made of a photoresist material, is generally manufactured by steps of coating, exposing, development, and the like.

In summary, the embodiments of the present disclosure provide a display panel. In the display panel, the second openings are formed in the portion of the black matrix pattern disposed in the non-crosstalk regions to increase beams emitted from the non-crosstalk regions. Therefore, a proportion of beams emitted from the crosstalk regions outside the non-crosstalk regions to all beams emitted from the display panel decreases correspondingly. In this way, the crosstalk of the display panel is reduced, such that the problem that the display effect of the display panel in some practices is relatively poor due to severe crosstalk is solved, and the display effect of the display panel is improved.

In addition, as an area of a light-outputting region is increased, the transmittance of the display panel in the embodiments of the present disclosure is also increased, such that the luminance of the display panel is improved.

In addition, some embodiments of the present disclosure further provide a display apparatus. The display apparatus includes the display panel according to any one of the above embodiments. With the display panel, the display apparatus achieves technical effects similar to those of the display panel according to the above embodiments. For example, the crosstalk of the display apparatus is reduced, the luminance is also increased, and the display effect is improved.

In the present disclosure, the term "at least one of A and B" is merely an association relationship that describes associated objects, and indicates three relationships. For example, "at least one of A and B" may indicate three cases: only A exists, both A and B exist, and only B exists. Similarly, "at least one of A, B, and C" indicates seven relationships: only A exists, only B exists, only C exists, both A and B exist, both A and C exist, both C and B exist, and all of A, B, and C exist. Similarly, "at least one of A, B, C and D" indicates fifteen cases: only A exists, only B exists, only C exists, only D exists, both A and B exist, both A and C exist, both A and D exist, both C and B exist, both D and B exist, both C and D exist, all of A, B, and C exist, all of A, B, and D exist, all of A, C, and D exist, all of B, C, and D exist, and all of A, B, C, and D exist.

It is noted that, in the accompanying drawings, sizes of layers and regions may be exaggerated for clarity of illustration. In addition, it is to be understood that, in the case that an element or layer is referred to as being "on" another element or layer, the element or layer may be directly on the other element or layer, or there may be an intervening layer. Alternatively, it is to be understood that, in the case that an element or layer is "under" another element or layer, the element or layer may be directly under the other element or layer, or there may be more than one intervening element or layer therebetween. In addition, it is to be understood that, in the case that a layer or element is "between" two layers or elements, the layer or element may be the only layer or element disposed between the two layers or elements, or more than one intervening layer or element is disposed between the two layers or two elements. In the entire specification, similar reference marks indicate similar elements.

In the present disclosure, the terms "first" and "second" are only used for descriptive purposes and cannot be understood as indicating or implying relative importance. Unless otherwise defined, the term "a plurality of" refers to two or more.

Described above are merely optional embodiments of the present disclosure, and are not intended to limit the present disclosure. Within the spirit and principles of the disclosure, any modifications, equivalent substitutions, improvements, and the like are within the protection scope of the present disclosure.

What is claimed is:

1. A display panel, comprising:
   a base substrate;
   a display structure disposed on the base substrate;
   a black matrix pattern disposed on the base substrate, wherein the black matrix pattern comprises a plurality of first openings;
      wherein the display panel is provided with a plurality of sub-pixel regions arranged in rows and columns, and the first openings are disposed in the sub-pixel regions; and
   a cylindrical lens structure layer disposed on the base substrate, wherein the cylindrical lens structure layer comprises a plurality of strip-shaped cylindrical lens structure;
      wherein a specified included angle is defined between a length direction of the cylindrical lens structures and a column direction of the plurality of sub-pixel regions, the specified included angle is greater than 0 degrees and less than 90 degrees, the cylindrical lens structure layer has a plurality of focal lines in an orthographic projection on the black matrix pattern, the focal lines are parallel to the length direction of the cylindrical lens structures, the focal lines partition each sub-pixel region into a plurality of regions, and one of the plurality of regions is a non-crosstalk region;
   wherein the black matrix pattern further comprises second openings in the non-crosstalk regions, and the second openings are disposed outside regions where the first openings are disposed.

2. The display panel according to claim 1, wherein the non-crosstalk region is a region having a largest area among the plurality of regions; or in the case that two regions among the plurality of regions have a largest area, one of the two regions having the largest area is the non-crosstalk region.

3. The display panel according to claim 1, wherein the second openings are connected to the first openings in a direction parallel to the base substrate.

4. The display panel according to claim 1, wherein
   the plurality of sub-pixel regions are arranged in the display panel in rows and columns; and
   the black matrix pattern comprises a plurality of first black matrices parallel to a row direction of the plurality of sub-pixel regions, and a plurality of second black matrices parallel to a column direction of the plurality of sub-pixel regions, wherein the plurality of first black matrices and the plurality of second black matrices are interlaced to form the plurality of first openings; and the second openings are disposed in the first black matrices.

5. The display panel according to claim 4, wherein
   a distance between every two adjacent focal lines in the plurality of focal lines in the row direction is the same as a dimension of the sub-pixel region in the row direction; and
   the second opening is provided with two edges arranged in the row direction; one edge of the second opening in the row direction is coincident with a focal line on an edge of the non-crosstalk region, and the other edge of the second opening in the row direction is coincident with an edge of the sub-pixel region.

6. The display panel according to claim 5, wherein a dimension of the second opening in the column direction is less than or equal to 9% of a length of the sub-pixel region in the column direction.

7. The display panel according to claim 6, wherein the second opening is quadrilateral; and an edge of the second opening in the column direction is coincident with an edge of the first opening.

8. The display panel according to claim 4, wherein the second opening is disposed in at least one of every two adjacent first black matrices in the column direction.

9. The display panel according to claim 4, wherein a width of the first black matrix is greater than a width of the second black matrix.

10. The display panel according to claim 1, wherein the second black matrix comprises an extending portion, the extending portion being in a crosstalk region in the sub-pixel region, the crosstalk region being a region outside the non-crosstalk region in the sub-pixel region.

11. The display panel according to claim 10, wherein the sub-pixel region is rectangular; the sub-pixel region comprises crosstalk regions at two diagonal corners of the sub-pixel region; and at least one of every two adjacent second black matrices in the row direction comprises the extending portion.

12. The display panel according to claim 1, wherein the display structure comprises a plurality of light-emitting units arranged in an array; or the display structure comprises a liquid crystal layer.

13. A display apparatus, comprising: a display panel; wherein the display panel comprises:
a base substrate;
a display structure disposed on the base substrate;
a black matrix pattern disposed on the base substrate, wherein the black matrix pattern comprises a plurality of first openings;
wherein the display panel is provided with a plurality of sub-pixel regions arranged in rows and columns, and the first openings are disposed in the sub-pixel regions; and
a cylindrical lens structure layer disposed on the base substrate, wherein the cylindrical lens structure layer comprises a plurality of strip-shaped cylindrical lens structure;
wherein a specified included angle is defined between a length direction of the cylindrical lens structures and a column direction of the plurality of sub-pixel regions, the specified included angle is greater than 0 degrees and less than 90 degrees, the cylindrical lens structure layer has a plurality of focal lines in an orthographic projection on the black matrix pattern, the focal lines are parallel to the length direction of the cylindrical lens structures, the focal lines partition each sub-pixel region into a plurality of regions, and one of the plurality of regions is a non-crosstalk region;
wherein the black matrix pattern further comprises second openings in the non-crosstalk regions, and the second openings are disposed outside regions where the first openings are disposed.

14. The display apparatus according to claim 13, wherein the non-crosstalk region is a region having a largest area among the plurality of regions; or in the case that two regions among the plurality of regions have a largest area, one of the two regions having the largest area is the non-crosstalk region.

15. The display apparatus according to claim 13, wherein the second openings are connected to the first openings in a direction parallel to the base substrate.

16. The display apparatus according to claim 13, wherein the plurality of sub-pixel regions are arranged in the display panel in rows and columns; and
the black matrix pattern comprises a plurality of first black matrices parallel to a row direction of the plurality of sub-pixel regions, and a plurality of second black matrices parallel to a column direction of the plurality of sub-pixel regions, wherein the plurality of first black matrices and the plurality of second black matrices are interlaced to form the plurality of first openings; and the second openings are disposed in the first black matrices.

17. The display apparatus according to claim 16, wherein a distance between every two adjacent focal lines in the plurality of focal lines in the row direction is the same as a dimension of the sub-pixel region in the row direction; and
the second opening is provided with two edges arranged in the row direction; one edge of the second opening in the row direction is coincident with a focal line on an edge of the non-crosstalk region, and the other edge of the second opening in the row direction is coincident with an edge of the sub-pixel region.

18. The display apparatus according to claim 17, wherein a dimension of the second opening in the column direction is less than or equal to 9% of a length of the sub-pixel region in the column direction.

19. The display apparatus according to claim 18, wherein the second opening is quadrilateral; and an edge of the second opening in the row direction is coincident with an edge of the first opening.

20. The display apparatus according to claim 16, wherein the second opening is disposed in at least one of every two adjacent first black matrices in the column direction.

* * * * *